United States Patent
Lee

(10) Patent No.: US 6,762,458 B2
(45) Date of Patent: Jul. 13, 2004

(54) HIGH VOLTAGE TRANSISTOR AND METHOD FOR FABRICATING THE SAME

(75) Inventor: Da Soon Lee, Kyonggi-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/118,965

(22) Filed: Apr. 10, 2002

(65) Prior Publication Data

US 2002/0158290 A1 Oct. 31, 2002

(30) Foreign Application Priority Data

Apr. 28, 2001 (KR) .......................................... 2001-23181

(51) Int. Cl.[7] .......................... H01L 29/76; H01L 29/94; H01L 31/062; H01L 31/113
(52) U.S. Cl. ........................ 257/344; 257/408; 257/409; 257/330
(58) Field of Search ................................ 257/344, 408, 257/409, 330

(56) References Cited

U.S. PATENT DOCUMENTS 5,705,840 A * 1/1998 Shen et al. ................. 257/344

FOREIGN PATENT DOCUMENTS

JP 4-212466 * 8/1992 .................. 257/344

OTHER PUBLICATIONS

Z. Parpia et al., "Optimization of Resurf LDMOS Transistors: An Analytical Approach", IEEE Transactions on Electron Devices, vol. 37, No. 3, pp. 789–796, Mar. 1990.
Z. Parpia et al., "A Novel CMOS–Compatible High–Voltage Transistor Structure", Reprinted IEEE Trans. Electron Devices, vol. ED–33, pp. 1948–1952, Dec. 1986.

* cited by examiner

Primary Examiner—Steven Loke
(74) Attorney, Agent, or Firm—Finnegan, Henderson, Farabow, Garrett & Dunner, L.L.P.

(57) ABSTRACT

In a high voltage transistor and a method for fabricating the same, a semiconductor substrate includes first, second, and third regions, the second and third regions neighboring the first region with boundaries. The first and second drift regions are respectively formed in the second and third regions at a first depth. Insulating films are formed at a second depth less than the first depth, having a predetermined width respectively based on the boundary between the first and second regions and the boundary between the first and third regions. A channel ion injection region is formed with a variable depth along a surface of the semiconductor substrate belonging to the first region and the insulating films. A gate insulating film is formed on the channel ion injection region, partially overlapping the insulating films at both sides around the channel ion injection region. Drain and source regions are formed within the first and second drift regions, respectively, and a gate electrode is formed to surround the gate insulating film and to partially overlap the insulating films.

4 Claims, 6 Drawing Sheets

US 6,762,458 B2

HIGH VOLTAGE TRANSISTOR AND METHOD FOR FABRICATING THE SAME

CROSS-REFERENCE TO RELATED APPLICATION

This application claims benefit of priority under 35 U.S.C. § 119 to Korean Application Serial No. 2001-23181 filed Apr. 28, 2001, the entire contents of which are incorporated by reference herein.

FIELD OF THE INVENTION

The present invention relates to semiconductor transistors and methods for fabricating the same, more particularly, to high voltage transistors and methods for fabricating the same that improves voltage-resistant characteristics and packing density.

BACKGROUND OF THE INVENTION

Generally, where an external system which employs a high voltage is controlled by an integrated circuit, the integrated circuit requires a device for controlling the high voltage. The device requires a structure having a high breakdown voltage.

In other words, for a drain or source of a transistor, to which a high voltage is directly applied, the punch-through voltage between the drain, source, and a semiconductor substrate and a breakdown voltage between the drain, source, and a well or substrate should be greater than the high voltage.

A double-diffused metal oxide semiconductor (DMOS) having a PN diode therein is generally used as a semiconductor device for high voltages. In this case, a drain region is formed as a double impurity diffused region so that the punch-through voltage and the breakdown voltage of the transistor become high, while a PN diode is formed between the source and drain, to prevent the device from being broken down by overvoltage when the transistor is turned off.

A known high voltage transistor and a method for fabricating the same will be described with reference to the accompanying drawings.

FIG. 1 is a sectional view illustrating a known high voltage transistor in the art, and FIG. 2 is a sectional view illustrating another known high voltage transistor in the art.

Examples of high voltage transistors include a lateral diffused metal oxide semiconductor (LDMOS) transistor and a double diffused drain (DDD) MOS transistor.

FIG. 1 shows an LDMOS transistor. The LDMOS transistor includes an n-type semiconductor substrate 11, a p-type well 12, a drain region 13, a source region 14, a gate oxide film 15, a gate electrode 16, a drain contact 17, and a source contact 18. P-type well 12 is formed in a predetermined portion of semiconductor substrate 11. Drain region 13 is formed as an n-type heavily doped (n+) impurity layer in one region within p-type well 12 at a predetermined depth. Source region 14 is formed as an n-type heavily doped impurity layer in one region of semiconductor substrate 11 at a predetermined distance from p-type well 12. Gate oxide film 15 is formed, having a first thickness, on drain region 13, p-type well 12, and semiconductor substrate 11 adjacent to p-type well 12. Gate oxide film 15 is also formed, having a second thickness greater than the first thickness, on source region 14 and semiconductor substrate 11 adjacent to source region 14. Gate electrode 16 is formed on a predetermined region of gate oxide film 15 at a predetermined distance from source region 14, overlapping drain region 13 and p-type well 12 adjacent to drain region 13 at an upper portion. Drain contact 17 and source contact 18 are in respective contact with drain region 13 and source region 14 through gate oxide film 15.

FIG. 2 shows a high voltage transistor having a DDD structure. The high voltage transistor having a DDD structure includes a p-type substrate 21, a gate oxide film 25, a gate electrode 26, an n-type drift region 22, an n-type heavily doped drain region 23, an n-type heavily doped source region 24, a drain contact 27, and a source contact 28. Gate oxide film 25 is formed on p-type substrate 21. Gate electrode 26 is formed in a predetermined portion on gate oxide film 25. N-type drift region 22 is formed in semiconductor substrate 21 at both sides below the gate electrode 26 at a predetermined depth, partially overlapping gate electrode 26 at a lower edge of gate electrode 26. N-type heavily doped drain region 23 is formed within drift region 22 at one side of gate electrode 26. N-type heavily doped source region 24 is formed within drift region 22 at the other side of gate electrode 26. Drain contact 27 and source contact 28 are in respective contact with drain region 23 and source region 24 through gate oxide film 25.

In known high voltage transistors, to improve voltage-resistant characteristics, the distance between the edge portion of the gate electrode and the heavily doped source and drain regions, i.e., the traverse length of the drift region is increased. The increased length of the drift region increases the size of the high voltage transistor and, as a consequence, this reduces packing density.

SUMMARY OF THE INVENTION

Accordingly, the present invention is directed to high voltage transistors and methods for fabricating the same. The present invention provides a high voltage transistor and a method for fabricating the same that improves voltage-resistant characteristics and reduces a size of a device to improve packing density.

In accordance with the invention, a high voltage transistor includes a semiconductor substrate having a first region and second and third regions, the second and third regions neighboring to the first region with boundaries, first and second drift regions respectively formed in the second and third regions at a first depth, insulating films formed at a second depth less than the first depth, having a predetermined width respectively based on the boundary between the first and second regions and the boundary between the first and third regions, a channel ion injection region formed with a variable depth along a surface of the semiconductor substrate belonging to the first region and the insulating films, a gate insulating film formed on the channel ion injection region, partially overlapping the insulating films at both sides around the channel ion injection region, source and drain regions formed within the first and second drift regions, and a gate electrode formed to surround the gate insulating film and to partially overlap the insulating films.

In another aspect of the present invention, a method for fabricating a high voltage transistor includes the steps of forming first and second drift regions in a predetermined region of a semiconductor substrate, forming drain and source regions within the first and second drift regions, respectively forming trenches, having a predetermined width, in the first and second regions around a boundary between the first and second drift regions and the semiconductor substrate between the source and drain regions, exposing the semiconductor substrate, forming a channel region within a surface of the exposed semiconductor substrate, burying an insulating film in the trenches, forming a gate insulating film on the semiconductor substrate including the channel region and on the insulating film at both sides of the semiconductor substrate, and forming a gate electrode at an upper portion and both sides of the gate insulating film.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

BRIEF DESCRIPTION OF THE DRAWINGS

The accompanying drawings illustrate embodiments of the invention and, together with the description, serve to explain the principles of the invention. In the drawings.

DESCRIPTION OF THE EMBODIMENTS

Reference will now be made in detail to the embodiments of the present invention, examples of which are illustrated in the accompanying drawings.

FIGS. 3A to 3M are sectional views illustrating process steps for making a high voltage transistor according to an embodiment of the present invention.

Figure 1:
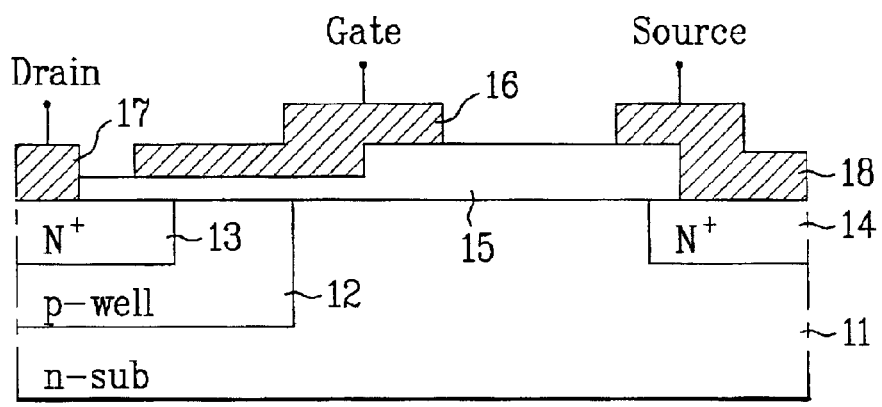
FIG. 1 is a sectional view illustrating a known high voltage transistor.
Figure 2:
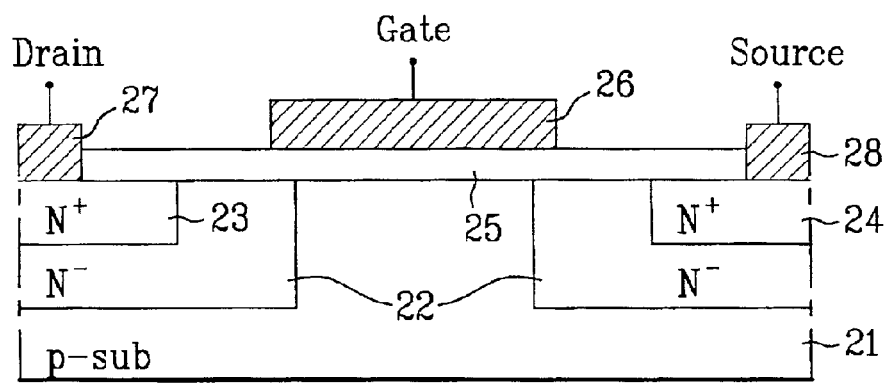
FIG. 2 is a sectional view illustrating another known high voltage transistor.
Figure 3A:
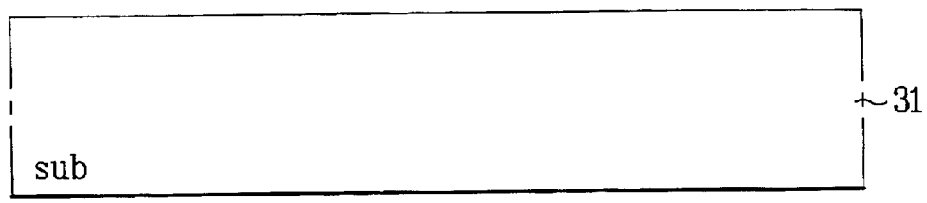
FIGS. 3A to 3M are sectional views illustrating steps for making a high voltage transistor according to the present invention.
Figure 3B:
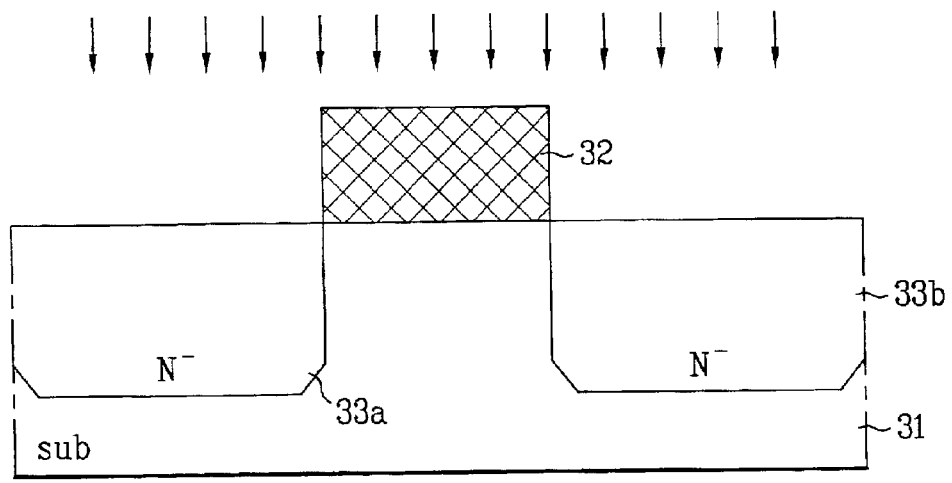
Figure 3C:
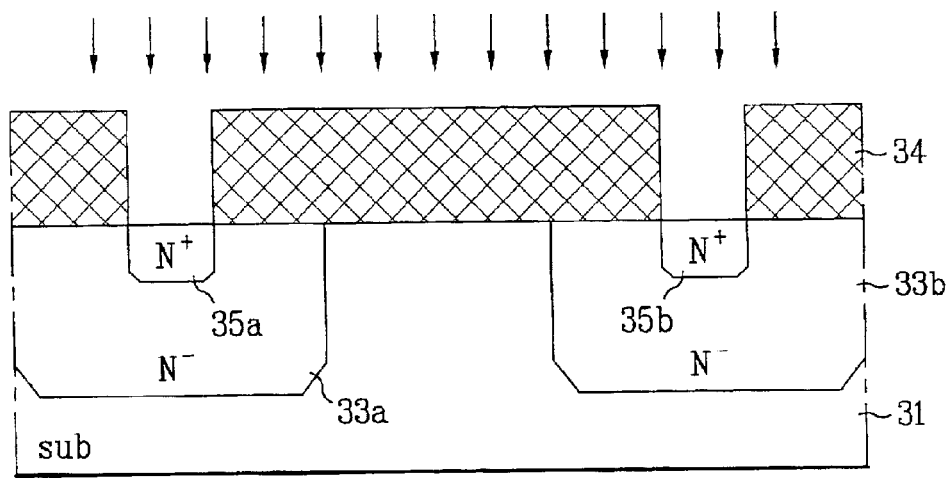
Figure 3D:
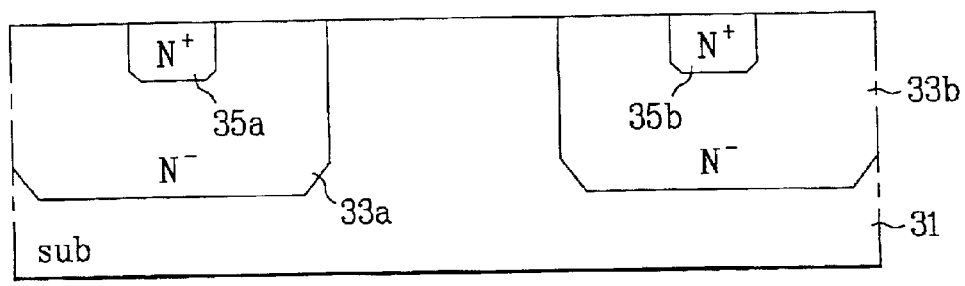
Figure 3E:
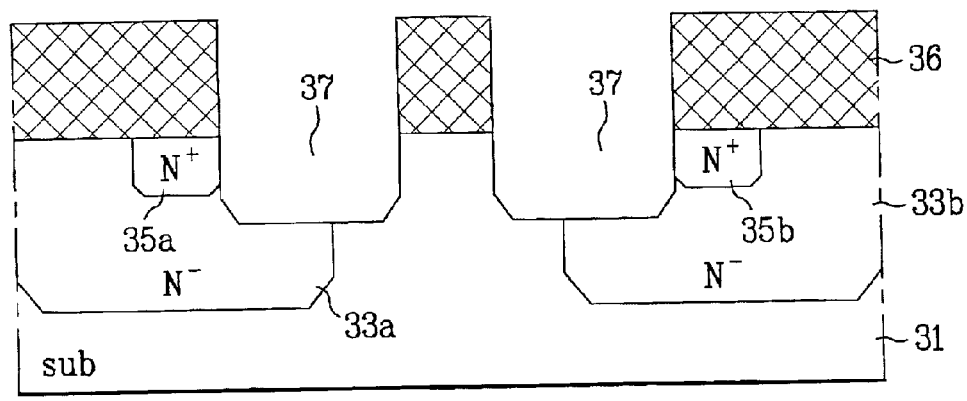
Figure 3F:
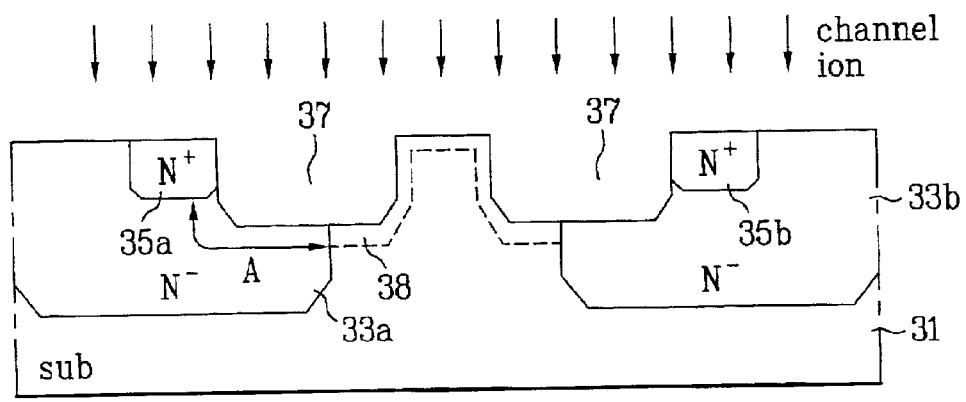
Figure 3G:
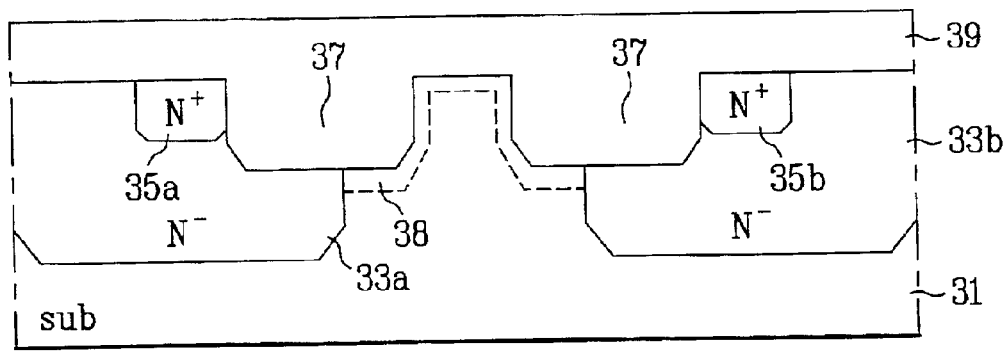
Figure 3H:
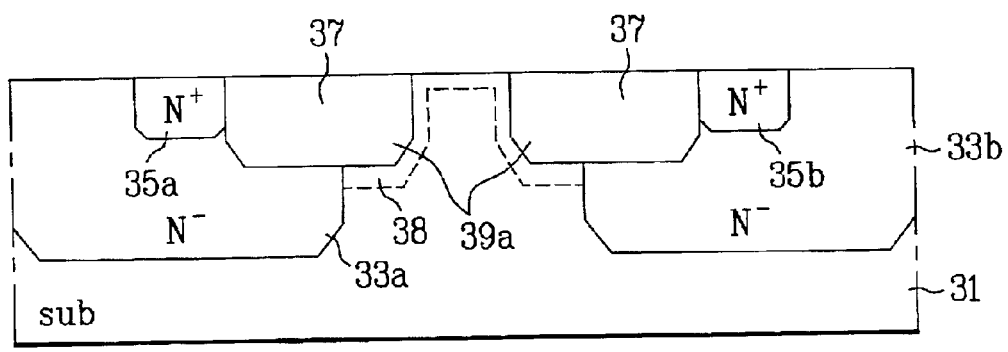
Figure 3I:
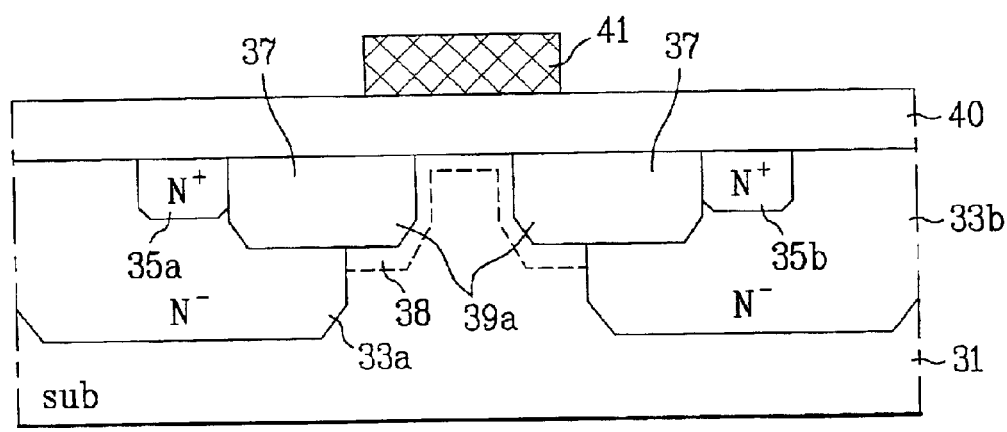
Figure 3J:
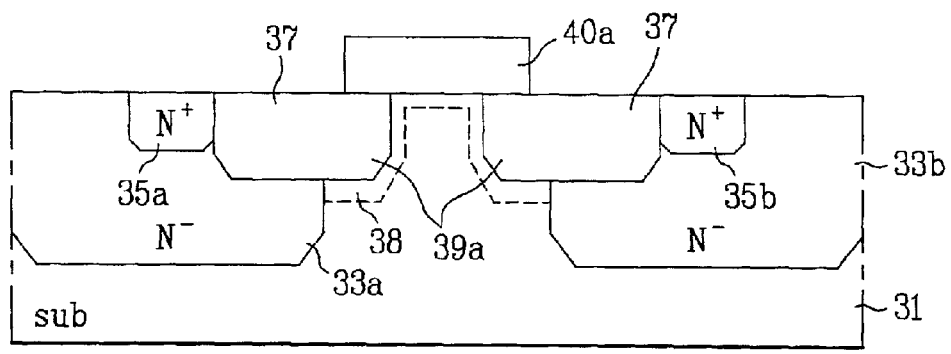
Figure 3K:
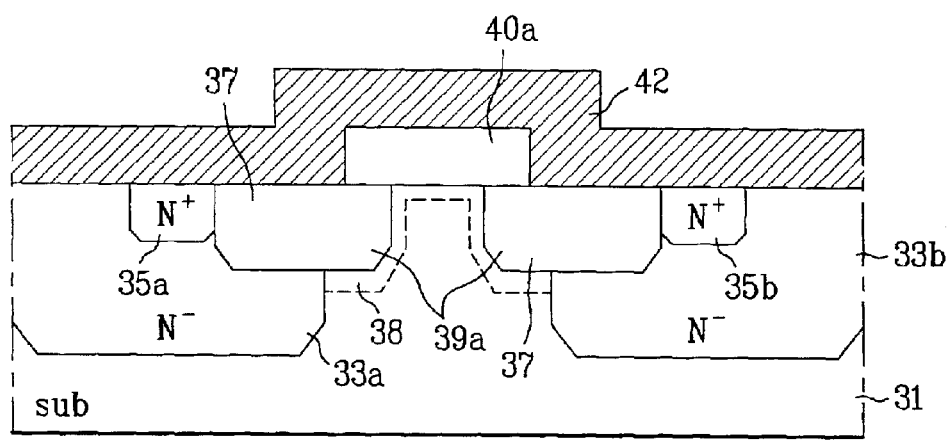
Figure 3L:
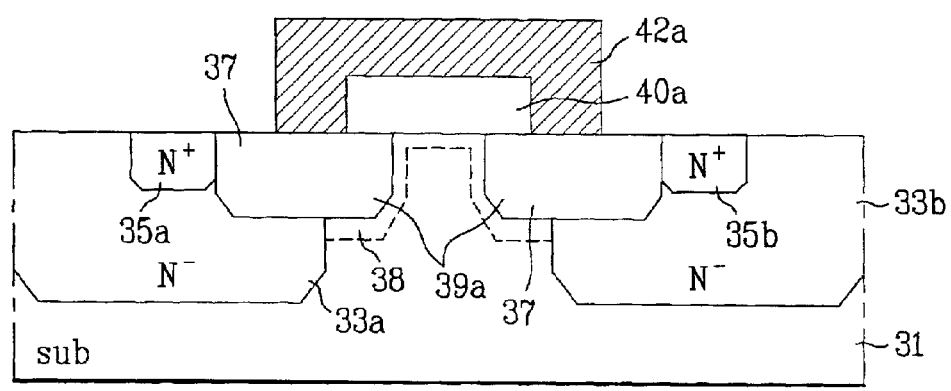
Figure 3M:
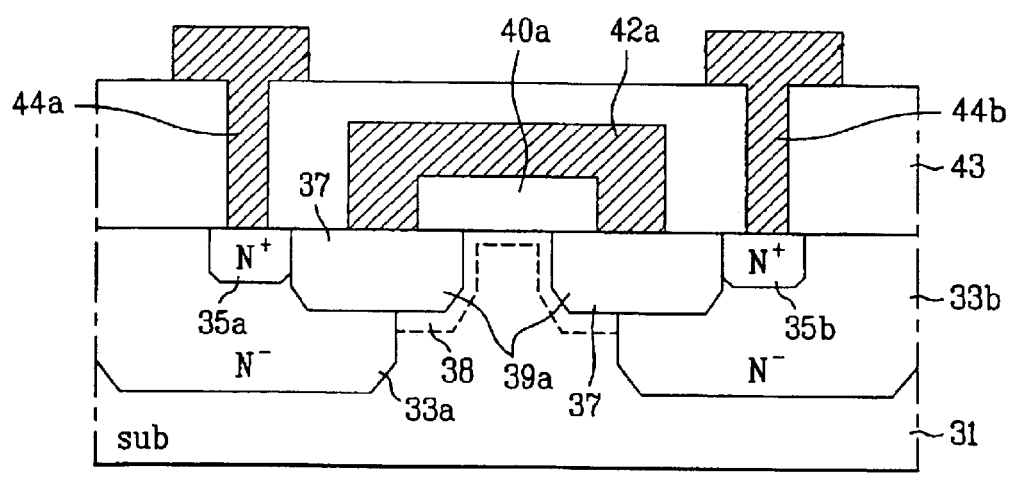

As shown in FIG. 3M, a high voltage transistor according to the present invention includes a semiconductor substrate 31, n-type lightly doped (n−) first and second drift regions 33a and 33b, a drain region 35a, a source region 35b, trenches 37, a channel region 38, a first oxide film 39a, a gate oxide film 40a, a gate electrode 42a, an interleaving insulating film (boron phosphorus silicate glass (BPSG)) 43, and a drain contact 44a, and a source contact 44b. N-type lightly doped first and second drift regions 33a and 33b are formed in a predetermined region of semiconductor substrate 31 at a first depth. The drain and source regions 35a and 35b are formed respectively within first and second drift regions 33a and 33b at a second depth less than the first depth. Trenches 37 are formed in semiconductor substrate 31 between drain region 35a and source region 35b including the boundary between the first and drift regions 33a and 33b. Trenches 37 have a third depth less than the first depth and greater than the second depth. Channel region 38 is formed between first and second drift regions 33a and 33b along the surface of semiconductor substrate 31 including trenches 37. First oxide film 39a is formed by filling or burying the film in trenches 37. Gate oxide film 40a is formed on semiconductor substrate 31 including channel region 38 and on first oxide film 39a adjacent to the semiconductor substrate 31. Gate electrode 42a is formed at an upper portion and both sides of gate oxide film 40a and is insulated from semiconductor 31 by first oxide film 39a at both edges. BPSG film 43 is formed on an entire surface of semiconductor substrate 31 including gate electrode 42a.

Drain contact 44a and source contact 44b are respectively connected with drain region 35a and source region 35b through BPSG film 43.

A method for fabricating the aforementioned high voltage transistor according to the present invention is now described.

As shown in FIG. 3A, a first photoresist is deposited on a semiconductor substrate 31 and then selectively patterned by exposure and developing processes as shown in FIG. 3B.

Subsequently, as shown in FIG. 3B, an n-type lightly doped (n−) impurity ion is injected into an entire surface of semiconductor substrate 31 using patterned first photoresist 32 as a mask so that first and second drift regions 33a and 33b are formed in semiconductor substrate 31 at a first depth.

First photoresist 32 is then removed. As shown in FIG. 3C, a second photoresist 34 is deposited on the entire surface of semiconductor substrate 31 and then selectively patterned by conventional exposure and developing processes so that first and second drift regions 33a and 33b are partially exposed.

An n-type heavily doped (n+) impurity ion is injected into the entire surface using patterned second photoresist 34 as a mask. Thus, a drain region 35a having a second depth less than the first depth is formed in a region of first drift region 33a while a source region 35b having the second depth is formed in a region of second drift region 33b.

As shown in FIG. 3D, second photoresist 34 is removed and a high temperature annealing process is performed.

As shown in FIG. 3E, a third photoresist 36 is deposited and then selectively patterned by conventional exposure and developing processes. Thus, first drift region 33a adjacent to drain region 35a, semiconductor substrate 31 adjacent to first drift region 33a, second drift region 33b, and semiconductor substrate 31 adjacent to second drift region 33b are exposed between drain region 35a and source region 35b.

Afterwards, semiconductor substrate 31 is etched at a third depth less than the first depth and greater than the second depth using the patterned third photoresist 36 as a mask to form trenches 37.

Third photoresist 36 is then removed. As shown in FIG. 3F, a channel ion for controlling a threshold voltage Vth is injected into the entire surface so that a channel region 38 is formed on the surface of semiconductor substrate 31 between first and second drift regions 33a and 33b.

Since trenches 37 are formed between source region 35a and channel region 38 and between drain region 35b and channel region 38, the distance A between the drain region 35a and the channel region 38 and between the source region 35b and the channel region 38 remains small.

Subsequently, as shown in FIG. 3G, a first oxide film 39 is deposited on the entire surface of semiconductor substrate 31 so that trenches 37 are completely filled. First oxide film 39 is etched-back so that first oxide film 39 remains within trenches 37, as shown in FIG. 3H, so that the first oxide film 39a is formed.

As shown in FIG. 3I, a second oxide film 40 is deposited on the entire surface of semiconductor substrate 31 and a fourth photoresist 41 is deposited on second oxide film 40.

Second oxide film 40 is formed thickly so as to have resistance to a high voltage.

Fourth photoresist 41 is selectively patterned by exposure and developing processes leaving fourth photoresist on semiconductor substrate 31 including channel region 38 and a region adjacent to semiconductor substrate 31.

Subsequently, as shown in FIG. 3J, second oxide film 40 is selectively removed using patterned fourth photoresist 41 as a mask to form a gate oxide film 40a. Fourth photoresist 41 is then removed.

As shown in FIGS. 3K and 3L, a polysilicon film 42 is deposited on the entire surface of semiconductor substrate 31 and then selectively removed by conventional photolithography and etching processes leaving an upper portion and a side of gate oxide film 40a. Thus, as shown in FIG. 3L, a gate electrode 42a is formed.

As shown in FIG. 3M, an interleaving insulating film (BPSG film) 43 is deposited on the entire surface and then selectively removed by conventional photolithography and etching processes to expose surfaces of drain region 35a and source region 35b.

Afterwards, another polysilicon film is deposited on the entire surface including the contact hole and then selectively removed by conventional photolithography and etching processes so that the polysilicon film remains in contact holes 46 and their adjacent region. Thus, a drain contact 44a contacted with drain region 35a and a source contact 44b contacted with source region 35b are formed. As a result, the high voltage transistor according to the present invention is completed.

The high voltage transistor and the method for fabricating the same according to the present invention include the following advantages.

Since the distance between the source and drain regions and the channel region can be increased by the oxide film formed through the trench, voltage-resistant characteristics to protect the high voltage transistor can be improved. Also, since the distance between the source and drain regions and the channel region can be increased without increasing the length of the drift region, packing density of the semiconductor device can be improved. Further, since the gate oxide film can be thickly formed, voltage-resistant characteristics to protect against the high voltage applied to the gate electrode can be improved. Finally, since no large process step difference is generated, a metal line formed in a later process can easily be formed.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A high voltage transistor comprising:

a semiconductor substrate having a first region and second and third regions, the second and third regions neighboring the first region;

first and second drift regions respectively formed in the second and third regions at a first depth from an upper surface of the semiconductor substrate;

insulating films formed at a second depth less than the first depth from the upper surface of the semiconductor substrate, having a predetermined width respectively based on the boundary between the first and second regions and the boundary between the first and third regions;

a channel ion injection region formed, having a variable depth, along a surface of the semiconductor substrate belonging to the first region and the insulating films, wherein the channel ion injection region is formed on the surface of the semiconductor substrate, corresponding to the first region in which the insulating films are not formed, and on the surface of the semiconductor substrate below the insulating films formed from the boundary between the first and second regions to the boundary between the first and third regions;

a gate insulating film formed on the channel ion injection region partially overlapping the insulating films at both sides of the channel ion injection region;

drain and source regions respectively formed within the first and second drift regions; and a gate electrode formed to surround the gate insulating film and to partially overlap the insulating films.

2. The high voltage transistor of claim 1, wherein the drain and source regions are adjacent to the insulating films at one side, respectively.

3. The high voltage transistor of claim 1, further comprising another insulating film formed having contact holes on the drain and source regions and a conductive line in contact with each of the drain and source regions through a respective contact hole.

4. The high voltage transistor of claim 1, wherein the gate electrode has a predetermined thickness at an upper portion and a side of the gate insulating film and is spaced apart from the drain and source regions through the insulating films.

* * * * *